United States Patent [19]

Roberts et al.

[11] Patent Number: 4,824,379

[45] Date of Patent: Apr. 25, 1989

[54] FLEXIBLE CIRCUIT CONNECTION ASSEMBLY

[75] Inventors: Joseph A. Roberts, Hudson; Thomas H. Stearns, Nashua, both of N.H.

[73] Assignee: Advanced Circuit Technology, Nashua, N.H.

[21] Appl. No.: 686,631

[22] Filed: Dec. 31, 1984

Related U.S. Application Data

[63] Continuation of Ser. No. 416,490, Sep. 10, 1982, abandoned.

[51] Int. Cl.[4] ................................................ H05K 1/00
[52] U.S. Cl. ........................................ 439/77; 439/65; 439/329
[58] Field of Search .................... 439/65, 912, 73, 77, 439/152, 153, 266, 267, 270, 260, 329, 330, 331, 370

[56] References Cited

U.S. PATENT DOCUMENTS

| | | | |
|---|---|---|---|
| 3,107,961 | 10/1963 | Hahn et al. | 339/75 MP |
| 3,114,587 | 12/1963 | Herrmann | 339/75 MP |
| 3,629,787 | 12/1971 | Wilson | 339/75 MP |
| 3,851,294 | 11/1974 | Palazzetti et al. | 339/17 F |
| 4,069,403 | 1/1978 | Beaudette et al. | 339/75 MP |
| 4,076,362 | 2/1978 | Ichimura | 339/75 MP |
| 4,179,171 | 12/1979 | Shannon | 339/75 M |
| 4,252,392 | 2/1981 | Whiteman, Jr. | 339/176 MF |
| 4,417,779 | 11/1983 | Wilson | 339/75 MP |

FOREIGN PATENT DOCUMENTS 0699570 12/1964 Canada .......................... 339/17 F Primary Examiner—David Pirlot
Attorney, Agent, or Firm—Nutter, McClennen & Fish

[57] ABSTRACT

In a flexible circuit connector assembly, a first circuit has exposed contacts which are positioned in register with the termination pads of another circuit by means of a connector which mechanically clamps the two circuits together. The connector includes a frame having an undersurface to which the first circuit is affixed. Locating posts project from that surface and are received in locating apertures in the second circuit to properly position the connector and the attached circuit relative to the second circuit. A generally C-shaped spring member engages around the frame with its arms extending beyond the locating posts and with its bridging segment extending more or less parallel to the frame reference surface. An actuator mounted to the frame is movable between a releasing position wherein it deflects the spring bridging segment toward the frame reference surface to spread apart the arm hooks so that they are aligned with the locating posts, thereby permitting those posts to be inserted into the circuit apertures.

33 Claims, 3 Drawing Sheets

FLEXIBLE CIRCUIT CONNECTION ASSEMBLY

This application is a continuation of application Ser. No. 416,490 filed Sept. 10, 1982 now abandoned.

This invention relates to a flexible printed circuit assembly. It relates more particularly to a novel mode of mechanically and electrically connecting a flexible printed circuit to another printed circuit.

BACKGROUND OF THE INVENTION

A flexible printed circuit is composed of an array of flexible electrical conductors mounted to a flexible electrically insulating support structure or ribbon. Such flexible printed circuits are used to electrically interconnect various components and subassemblies of electronic equipment such as computers, digital printers, video terminals, etc. Because they are flexible, these circuits can be routed along sinuous courses to effect such interconnections.

In one application with which we are primarily concerned here, such flexible printed circuits are used to releasably interconnect different printed circuit boards within a piece of electronic equipment. Accordingly, connectors are provided at the opposite ends of the flexible printed circuit. Each connector usually consists of stamped contacts captured in a plastic housing, each contact being connected to a conductor in the printed circuit. That connector is then coupled to a mating connector mounted to the printed circuit board and whose contacts connect with various printed circuit paths on that board. When the connectors are coupled together, their contacts touch or interfit, thereby establishing electrical connections between the end of the flexible printed circuit and the PC board.

Needless to say, the termination of flexible printed circuits in this fashion is a time-consuming and expensive proposition. The connectors have to be mounted to the opposite ends of the flexible circuit and connections have to be made between the various circuit conductors and the connector contacts by soldering, wirewrapping, or the like. The same thing has to be done with the mating connectors on the PC boards. Further, as a result of their construction, the prior connectors are relatively large and bulky. Therefore, they limit the number of printed circuit boards that can be packed in a given volume inside the electronic equipment. In other words, PC boards are normally arranged parallel to one another in rows or stacks and the prior connectors of this general type, because of their size, limit the minimum distance between adjacent boards.

Another problem with prior circuit assemblies of this type stems from the fact that the coupling of the flexible circuit connector to the mating connector on the PC board requires that a coupling force be applied which sometimes stresses the board to the extent that other circuit paths on the board are interrupted or damaged. Also, some prior connection assemblies do not provide adequate strain relief for the flexible circuit and some do not maintain reliable electrical connections between the circuit and the PC board when the assembly is subjected to vibration and shock.

There do exist prior connectors for flexible circuits and interconnect cables which do not require a mating connector on the PC board. One such device is disclosed in U.S. Pat. No. 4,025,142. In that arrangement, a connector is mounted to the end of the flexible printed circuit and the circuit conductors are electrically connected to the connector terminals. The connector is designed to be positioned flush against a PC board so that its terminals make contact with exposed pads on the board that terminate the board conductors. The connector is held against the board by a clamp which engages over the connector and clips to openings in the PC board.

That arrangement still has the disadvantage of requiring connections between each flexible circuit conductor and the connector. Also, that prior connector is rather bulky so that it limits the minimum distance between adjacent PC boards in a board stack. Still further, it is a relatively complicated and costly item to manufacture because it is composed of stamped metal terminals encased in a molded plastic housing.

We are also aware of an assembly for connecting a flexible circuit to a PC board wherein the flexible circuit conductors are coupled directly to the PC board termination pads thereby eliminating the need for the connector to include contacts or terminals. Such an assembly is disclosed in U.S. Pat. No. 4,054,348. Basically, the connector is a clamp member which clamps the flexible circuit contacts to the electrical pads or contacts of a PC board. The end of the flexible circuit is inserted through a slot in the connector so that the circuit contacts are exposed at the underside of the connector. Then, a pair of feet at the opposite ends of the connector are inserted through appropriate openings in the PC board near the edge thereof and the connector is pressed flush against the PC board so that the circuit and board contacts touch. A clip at the edge of the connector engages over the edge of the PC board, thereby locking the unit in place.

While that arrangement avoids the problems inherent in assemblies requiring mating connectors, it still has some disadvantages which limit its wider use and application. For example, the connector has to be installed on edge. Therefore, it limits the minimum spacing between adjacent PC boards in a stack. Also, it is difficult to insert and manipulate the connector to its locked position in a confined space. Further, the PC board conductors must be terminated adjacent an edge of the board. Moreover, when making the connection to the PC board, it is necessary to press the connector tightly against the board. This may result in bending of the board with possible damage to the board.

Also, that connector does not account for variations in the thicknesses of the materials comprising the two circuits so that its fit may not always be correct. Resultantly, it may impart undue bending stresses to the board or result in a poor connection along one or another of the conductive paths between the two circuits.

SUMMARY OF THE INVENTION

Accordingly, the present invention aims to provide an improved flexible circuit connector assembly.

Another object of the invention is to provide an assembly which establishes a reliable electrical and mechanical connection between a flexible printed circuit or cable and another circuit such as a PC board or a second flexible printed circuit.

A further object of the invention is to provide a connector assembly which requires no mating connector on the circuit to which the flexible circuit is coupled.

Another object of the invention is to provide a flexible printed circuit assembly which requires no soldering, wiring or special tools in order to effect the connection between the two circuits.

A further object is to provide a flexible circuit connector assembly which provides strain relief for the flexible circuit.

Yet another object of the invention is to provide a flexible circuit connector which is small and compact so that, when several such connectors are coupled to PC boards in a board stack, minimal clearance space is required between the adjacent boards in the stack.

Still another object of the invention is to provide a connector which is relatively easy and inexpensive to manufacture and assemble.

A further object of the invention is to provide an electrical connector of this general type which applies just the right coupling force between the flexible circuit and the other circuit to achieve reliable electrical and mechanical connections without unduly stressing the two circuits.

Another object is to provide such a connector which is easy to use so that connections can be made at locations out of the assembler's line of sight.

Yet another object is to provide a connector which facilitates making custom terminations for special PC board designs.

Other objects will, in part, be obvious and will, in part, appear hereinafter.

The invention accordingly comprises the features of construction, combination of elements and arrangement of parts which will be exemplified in the following detailed description, and the scope of the invention will be indicated in the claims.

Briefly, in the present assembly, an array of exposed electrical contacts at the end of a flexible printed circuit are clamped directly to a corresponding array of exposed electrical termination pads of another circuit by means of a contactless clamping mechanical connector. The connector comprises a frame having a reference surface to which is affixed the end of the flexible printed circuit so that the circuit contacts are exposed at the underside of the frame. Locating means on the frame and PC board properly locate the connector and its circuit relative to the PC board so that the circuit contacts are in register with the board termination pads or contacts.

A spring member is supported on the frame. This member includes a pair of spaced-apart arms which extend more or less perpendicular to the frame's reference surface. Corresponding first ends of the arms are located adjacent to the reference surface and are formed as hooks. Corresponding second ends of the arms are interconnected by a bridging segment that is spaced more or less parallel from the reference surface. The spring member is arranged on the frame so that, when its bridging segment is deflected from its normal relaxed position toward the reference surface, the free ends of the arms are spread apart and extended from the connector frame. On the other hand, when the bridging segment is deflected from its relaxed position away from the reference surface, the arm ends are retracted on the frame and draw toward one another.

The connector also includes an actuator movably mounted to the frame so as to engage the bridging segment of the spring member. The actuator is movable between a releasing position wherein it deflects the spring toward the reference surface and a locking position wherein it deflects the spring away from the reference surface. Accordingly, such movement of the actuator extends and retracts the spring arms as aforesaid. When the actuator is positioned between these two extremes, the spring member assumes its normal relaxed position.

In use, the flexible circuit is coupled mechanically and electrically to the PC board or other circuit by juxtaposing the connector to the PC board using the coacting locating means on the two circuits. The connector's actuator is then moved to its releasing position which spreads apart and extends the hooked ends of the spring member arms. Apertures are formed in the circuit being coupled to which register with the arm hooks when the two circuits are properly positioned relative to one another. Accordingly, the arm hooks can project through those apertures. Then the connector's actuator is moved to its intermediate position which allows the spring member to assume its relaxed condition so that its arm hooks draw toward one another. In so doing, they engage under the inboard walls of the board apertures.

Finally, the actuator is moved to its locking position. Such movement deflects the spring member bridging segment away from the reference surface. Resultantly, the arm ends are retracted on the frame so that the connector and its circuit are clamped firmly to the PC board. The arm ends are also urged toward one another, thereby assuring firm engagements of the arm hooks in the board apertures. Furthermore, energy is stored in the spring member to compensate for variations in the PC board thickness, thermal distortions and other variables which may affect the distance between the underside of the PC board and the connector reference surface. This assures that the two circuits are tightly clamped together and remain so even when subjected to vibration and shock. In one preferred connector embodiment to be described in detail later, the aforesaid clamping action causes the corresponding contacts of the two circuits to actually wipe against one another further assuring that those connections are mechanically intimate and thus offer negligible resistance to the current passing through the circuit conductors.

When the connector is coupled to the PC board as aforesaid, the flexible circuit contacts underlying the connector are pressed tightly against the PC board contacts. This high pressure contact breaks through any surface oxidation that may exist on the engaging contacts, thereby assuring very reliable, gas-tight, metal-to-metal connections between the two circuits.

Since the present connector is, in reality, a mechanical clamp which locates the contacts of a flexible circuit relative the contacts of another circuit and then applies the requisite coupling pressure to clamp the two circuits together, the connector can be much smaller and less weighty than conventional connectors of this general type.

As will be discussed in more detail later, the locating means on the connector accurately locate the contacts of the flexible circuit relative to the connector. They also help to provide strain relief for the flexible circuit. Those same means correctly position the connector relative to the PC board thereby facilitating out-of-sight assembly of the connector to that board. Moreover, during such assembly, substantially no force is applied to the board as might tend to unduly stress the board and damage the circuit paths thereon. Furthermore, due to its mode of connecting to the PC board, the present connector can connect to any location on that board. It can also be designed to the specific application assuring that just the proper amount of clamping pressure is obtained. In other words, the connector components can be scaled as needed depending upon the size of the circuits being connected and the number of contacts to be connected.

Also, since the connector's contacts are comprised of the flexible circuit itself, any changes in the termination pattern can be made quite inexpensively simply by modifying the pattern on the flexible circuit. Such changes do not involve any expensive retooling of the connector itself. Finally, because the present connector assembly comprises relatively few components which can be manufactured quite inexpensively in quantity, the overall cost of the assembly is kept to a minimum.

BRIEF DESCRIPTION OF THE DRAWINGS

For a fuller understanding of the nature and objects of the invention, reference should be had to the following detailed description, taken in connection with the accompanying drawings, in which.

DESCRIPTION OF THE PREFERRED EMBODIMENTS

Figure 1:
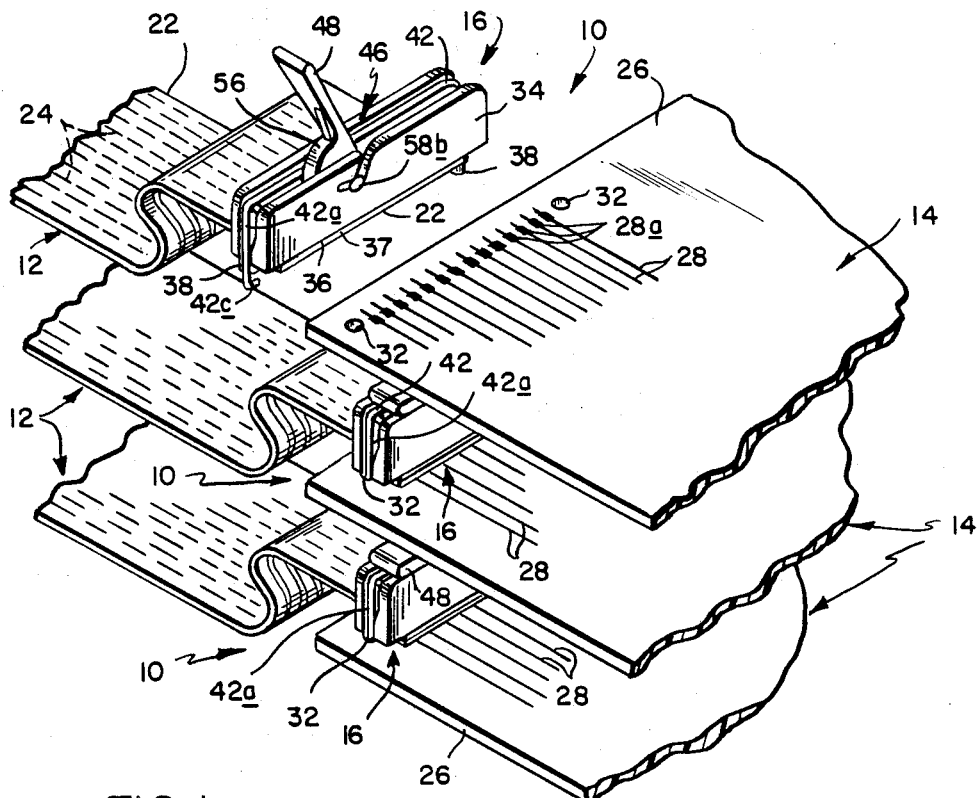
FIG. 1 is a fragmentary perspective view illustrating flexible circuit connection assemblies made in accordance with this invention.

Referring now to the drawings, FIG. 1 illustrates a vertical stack of three connector assemblies made in accordance with this invention, each such assembly being indicated generally at 10. The uppermost assembly is shown disconnected; the remaining two assemblies 10 are connected. Each assembly 10 comprises a flexible printed circuit or interconnect cable indicated generally at 12, a second circuit being connected to, namely a PC board 14 and a connector shown generally at 16.

Figure 2:
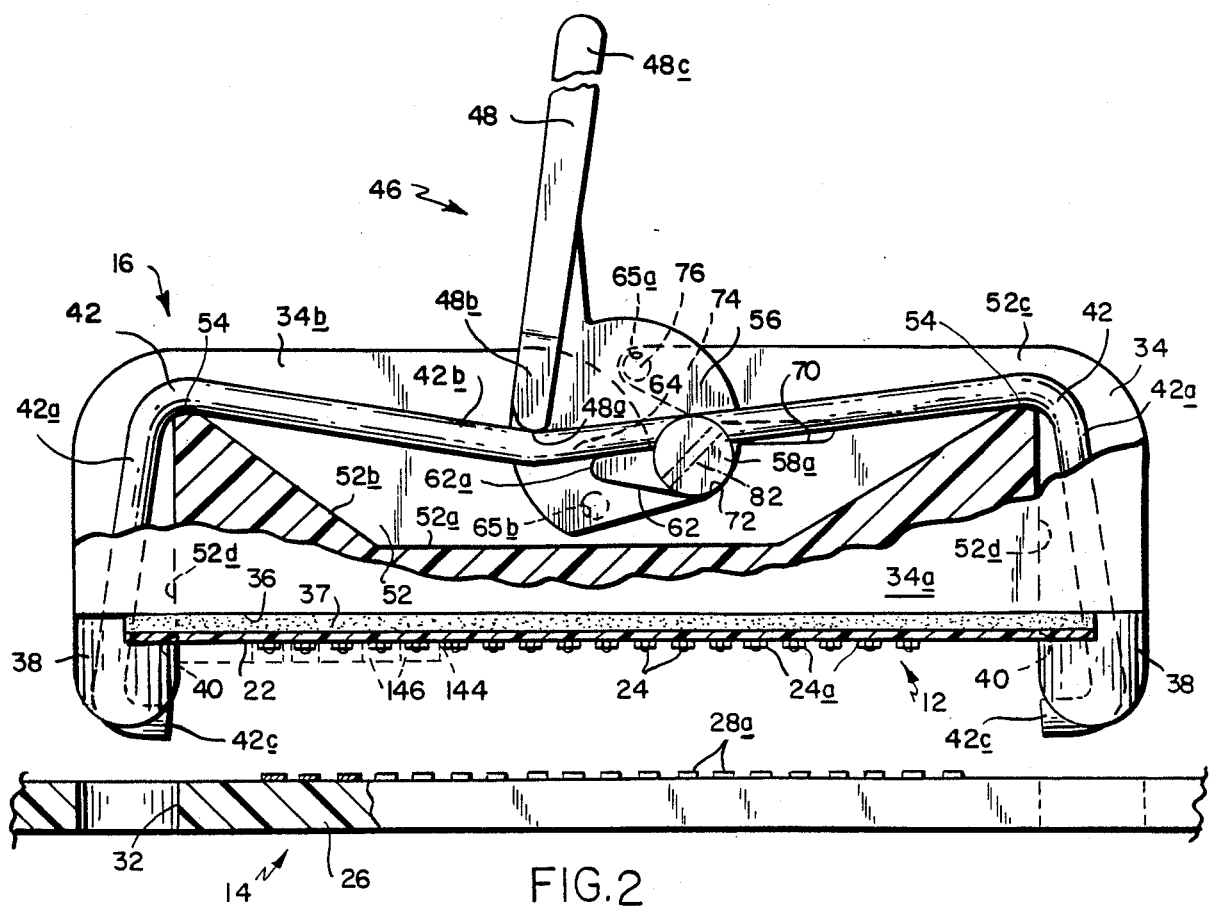
FIG. 2 is a rear elevational view of the assembly with parts broken away, the connector being shown in its releasing position.

As best seen in FIGS. 1 and 2, the flexible circuit 12 comprises an electrically insulating substrate 22 which supports a pattern of printed conductors 24. Each conductor 24 is terminated by a contact 24a and the end of circuit 12 is affixed to the underside of connector 16. The circuit or cable 12 may be of any conventional construction. The only requirement is that the circuit contacts 24a be exposed at the underside of the connector. Preferably, those contacts should be provided with raised pads or bumps to maximize the contact force when that circuit is coupled to board 14.

Board 14 is also of more or less standard construction. It comprises a rigid insulating substrate 26 upon which is printed a pattern of electrical conductors 28. These conductors are terminated by a series of termination pads 28a. In the illustrated embodiment, the pads are located adjacent an edge of the PC board 14. However, they could just as well be located at an interior location on the board. Also, while we have shown circuit 14 as a rigid PC board, it could just as well be another flexible circuit. Board 14 differs from conventional boards in order to accommodate connector 16 only in that it is formed with a pair of small apertures or openings 32 located at opposite ends of the series of termination pads 28a.

Still referring to FIGS. 1 and 2, connector 16 comprises an elongated, generally rectangular frame or body 34 preferably molded of a suitable strong, impact-resistant plastic material such as glass-filled polyester. The underside of frame 34 is formed as a reference surface 36 to which the end of the printed circuit 12 is affixed by an appropriate cement or by other means. Surface 36 is generally flat. However, it may be formed with small nubbles (not shown) at locations underlying flexible circuit contacts 24a in order to increase the contact pressure between those contacts and the PC board contacts 28a when the two circuits are coupled by connector 16. Also, if desired, a thin flat strip 37 of elastomeric material such as foam rubber may be interposed between the reference surface 36 and the flexible circuit 12 as best seen in FIG. 2. This permits the circuit 12 to flex and deform to some extent when it is coupled to the PC board 14 to accommodate irregularities in the thicknesses of the two circuits.

Locating means in the form of small posts 38 extend down from the opposite ends of the reference surface 36. These posts are dimensioned and positioned on the frame 34 such that, when the connector is positioned on the PC board with the circuit contacts 24a and 28a in register, the posts 38 are snugly received in the board apertures 32.

Preferably, the flexible circuit 12 is wider than the distance between posts 38 and the circuit substrate 22 is formed with semi-circular edge openings or notches 40 (FIG. 2) aligned with the circuit contacts 24a. These openings snugly receive connector posts 40 to positively establish the relative position of circuit 12 and connector 16. That engagement between circuit 12 and posts 38 also provides strain relief for circuit 12 in the area of its contacts with the PC board 14. Of course, if the connector 16 includes a resilient strip 37, shown in FIG. 2, similar registering notches are formed in that strip.

A generally C-shaped spring member 42 is engaged around the frame 34. Spring member 42 has a pair of spaced-apart generally parallel legs 42a which extend more or less perpendicular to the frame reference surface 36. The upper ends of arms 42a are connected by a bridging segment 42b that extends parallel to surface 36. The free ends of arms 42a project beyond the ends of posts 38 and are bent toward one another to form hooks 42c.

Figure 3:
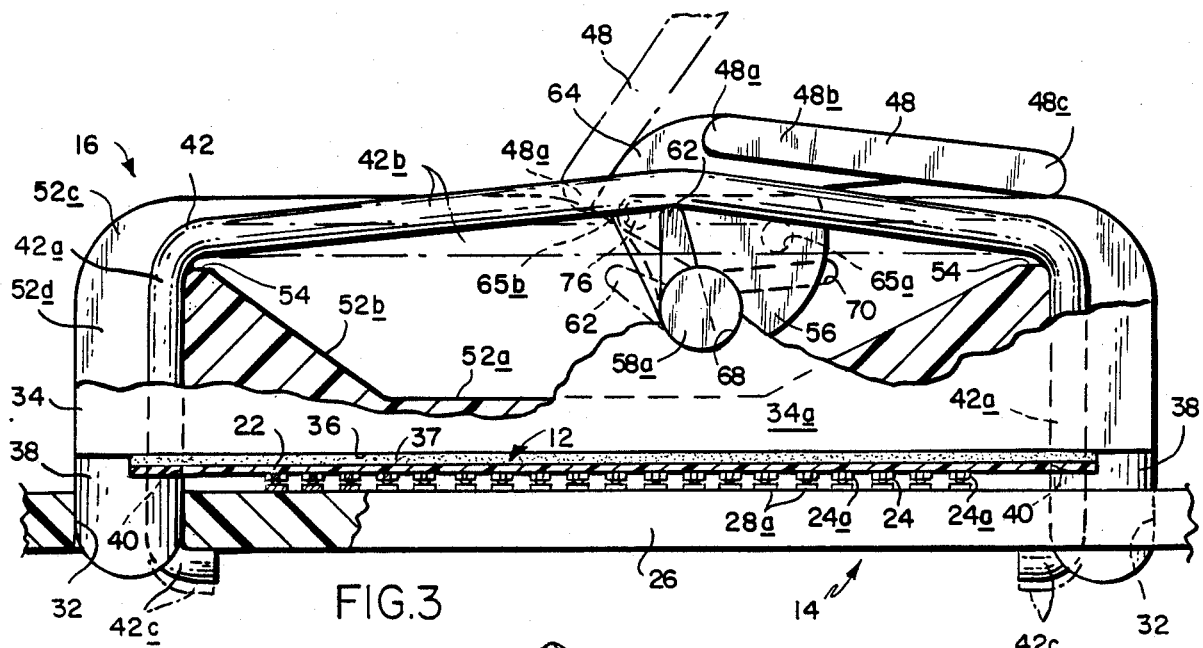
FIG. 3 is a similar view of the connector assembly showing the connector in its intermediate and locking positions.

Mounted to frame 34 in engagement with spring member 42 is an actuator shown generally at 46. The actuator includes a lever 48 which extends from the top of the frame 34. When the lever 48 is in its raised position as shown in the uppermost assembly 10 in FIG. 1 and in FIG. 2, the actuator 46 causes the spring member arms 42a to extend from frame 34 and to spread apart so that their end hooks 42c are in register with the PC board apertures 32 as shown in FIG. 2. This permits the connector 16 to be positioned against board 14 with the locating posts 38 engaging in the board apertures 32. That, in turn, automatically positions the contacts 24a of the flexible circuit 12 properly against the PC board termination pads 28a as best seen in FIG. 3. Next, the connector lever 48 is swung to its dotted line position shown in FIG. 3. This causes the actuator 46 to allow the spring member arms 42a to move toward one another to their relaxed dotted line positions shown in FIG. 3 so that they engage under the PC board 14 at the inboard edges of the locating apertures 32. Finally, the connector lever 48 is moved to its locking position as shown in the lowermost assembly 10 in FIG. 1 and in solid lines in FIG. 3. Such movement causes the actuator 46 to retract the spring member arms 42a on frame 34 and to urge those arms together so that their end hooks 42c draw up against the underside of the PC board 14 at the inboard edges of apertures 32. This firmly clamps the connector 16 and its underlying flexible circuit 12 to the PC board as best seen in FIG. 3.

Figure 4:
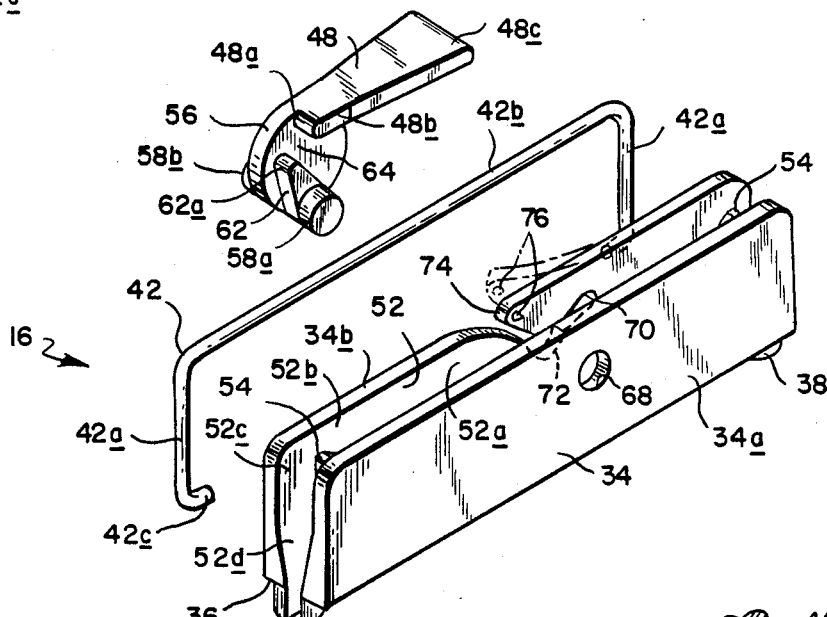
FIG. 4 is an exploded perspective view on a smaller scale showing the components of the connector in greater detail.

Referring now to FIGS. 2 and 4, the spring member 42 is actually engaged in a groove or slot 52 extending along the frame top and end walls including locating posts 38. Groove 52 has a relatively deep central segment 52a extending from the top wall almost to the reference surface 36. The slot becomes progressively shallower towards the ends of the frame at 52b reaching a minimum depth at 52c adjacent the upper corners thereof. Slot 52 then continues down adjacent the end walls of the frame having segments 52d which extend beyond the bottom of frame 34 to the free ends of the locating posts 38 so that the slot actually extends entirely through the posts. As best seen in FIG. 2, the slot configuration is such that it forms a pair of pivots or fulcrums 54 adjacent the upper corners of the frame.

The dimensions of the spring member 42 are such that the opposite ends of the spring member bridging segment 42b are positioned at the frame fulcrums 54 and the spring member arms 42a extend down through the slot segments 52d beyond the free ends of the locating posts 38. The lengths of the arm hooks 42c are such that when the spring member 42 is in its normal relaxed condition, the spring arms 42a extend down adjacent the inboard walls of posts 38 and the hook ends extend laterally beyond those walls as shown in dotted lines in FIG. 3.

When the spring bridging segment 42b is deflected from its relaxed position downward toward the frame reference surface 36, the spring member is pressed against the frame fulcrums 54 so that the arms 42a and their end hooks 42c are urged to an extended position on the frame. Furthermore, the spring member arms 42a are pivoted about the fulcrums 54 so that their end hooks 42c are spread apart by an amount which brings them into register with the locating posts 38 as best seen in FIG. 2. On the other hand, when the spring member bridging segment 42b is deflected from its relaxed position upwards away from the frame reference surface 36 as shown in FIG. 3, the arm hooks 42c are urged toward one another. Furthermore, the arms and hooks are retracted on the frame 36 so that their hooks are drawn close to that reference surface as seen in solid lines in that same figure.

Still referring to FIGS. 2 and 4, the spring member segment 42b is deflected by the actuator 46 which is a unitary part, preferably molded of the same material as the frame. The actuator includes a rotary body 56 to which the handle 48 is attached. The handle is more or less tangential to body 56 forming a nose 48a adjacent the body. A pair of stub shafts 58a and 58b project out from the opposite sides of body 56 at locations adjacent the edge of that body diametrically opposite the lever nose 48a. Also body 56 is formed with a generally triangular or wedge-shaped cam 62 which originates at the base of stub shaft 58a and extends along a chord of body 56 partway toward the upper edge of that body leaving a gap 64 between the lever nose 48a and the cam end 62a. A pair of dimples 65a and 65b (FIGS. 2 and 3) are provided in the front wall of body 56 adjacent shaft 58b for reasons that will become apparent later.

The combined thickness of body 56 and cam 62 is more or less the same as the width of the slot 52 in frame 34. Also, the segment 48b of lever 48 adjacent body 56 is notched so the total thickness of that segment is also more or less the same as the width of slot 52. The remainder of arm 48 extending all the way to its free end 48c has a thickness which corresponds more or less to the exterior thickness or depth of the connector frame 34.

As best seen in FIGS. 1, 2 and 3, actuator 46 is rotatively mounted in the connector frame 34. For this, a round opening 68 is formed in the frame rear wall 34a which extends into slot 52 at a location between fulcrums 54. Opening 68 is sized to snugly receive actuator stub shaft 58a so that it functions as a journal for that shaft. The frame front wall 34b is notched at 70 to form a semicircular surface 72 that is located directly opposite the lower edge of opening 68. Surface 72 is arranged to support and journal the other shaft 58b of actuator 46.

The notch 70 is also shaped to define a finger 74 which extends lengthwise along the frame wall 34b directly above surface 72. The finger 74 is flexible and resilient so that it can be deflected between a solid line position illustrated in FIG. 4 and a dotted line position shown in that same figure. A small bump or boss 76 is formed at the inner surface of finger 74 near the free end thereof which coacts with the aforementioned dimples 65a and 65b on actuator body 56 to define the locking and releasing positions of the actuator.

Referring to FIG. 4, the connector 16 is assembled by first clipping or engaging the spring member 42 in the frame groove 52 so that the spring member arms 42a extend down adjacent the ends of the frame and the bridging segment 42b stretches between the fulcrums 54. Next the actuator 46 is attached to the frame by bending the frame finger 74 outwardly as shown in FIG. 4 and forcing the actuator body 56 down into notch 70 so that the spring member bridging segment 42b is positioned in the gap 64 between lever 48 and cam 62. Next the actuator is manipulated until the stub shaft 58a is engaged in the frame opening 68 and shaft 58b is supported in the notch surface 72 in the frame front wall 34b. Then the finger 74 is released whereupon it resumes its relaxed position so as to overlie and rotatively retain shaft 58b against the surface 72.

Next, the end of the flexible circuit 12 is affixed to the reference surface 36 using a suitable cement. The flexible circuit notches 40 snugly receive the locating posts 38 so that both the lateral positions of the circuit relative to the connector is established from one assembly to another. Also as noted above, that post-notch engagement provides strain relief so that there is minimal likelihood of the circuit 12 becoming detached from connector 16 even if it should be subjected to relatively high tensile stress.

The connector 16 and its conductor 12 are assembled to board 14 by moving the actuator 46 to its releasing position using lever 48 as illustrated in FIG. 2. The engagement of the finger boss 76 in actuator dimple 65a retains the actuator in that position. In this position of the lever, the lever nose 48a engages and deflects the spring member bridging segment 42b downward toward frame reference surface 36. Such deflection urges the spring member arms 42a to their extended positions and causes them to pivot about the frame fulcrums 54 so that their end hooks 42c spread apart into alignment with the locating posts 38. The connector can now be seated on the PC board 14 with the locating posts 38 being received in the board apertures 32 so that the circuit contacts 24a and 28a touch.

Next the lever 48 is swung to its intermediate position shown in dotted lines in FIG. 3. In that position of the actuator, the spring bridging segment 42b extends straight through the actuator gap 64 so that it assumes its relaxed condition. Resultantly, the spring member arms 42a draw toward one another so that their end hooks 42c project beyond the inboard walls of locating posts 38 and apertures 32, engaging under board 14 in the process. Finally, the lever 48 is swung down to its locking position shown in solid lines in FIG. 3. This causes the actuator cam 62 to engage under the spring member so that it deflects the bridging segment 42b upwards away from frame reference surface 36. This results in an urging together of the spring member arms 42a and particularly the end hooks 42c, thereby assuring a firm grip on the inboard edges of the board apertures 32. That upward deflection also retracts the spring member on the frame so that the end hooks 42c are drawn up against the underside of board 14 thereby mechanically clamping connector 16 and circuit 12 very tightly to the board. Resultantly, excellent metal-to-metal contact is made between the circuit contacts assuring good electrical connections between the two circuits. Engagement of the finger boss 76 in dimple 65b maintains the actuator in its locking position.

It is important to note also that the upward deflection of the spring member 42 by cam 62 results in energy being stored in the spring member to compensate for variations in the thicknesses of the circuits 12 and 14 and for warps or distortions in those circuits. In other words, the two circuits are clamped together quite firmly yet resiliently by the connector 16. As noted previously, the resilient strip 37 if present, also helps in this respect.

The assembling of connector 16 to board 14 as aforesaid can be accomplished with substantially zero force being applied to the board. Consequently, no stresses are applied to the board 14 that could damage the various electrical conductors and components thereon. Moreover, such assembly can be accomplished even if the two circuits are out of the direct line of sight of the assembler. He simply locates the board apertures 32 with his fingers and positions the connector 16 so that the locating posts 38 are received in those apertures. This automatically centers the circuit contacts 24a directly above the board terminating pads 28a. Then the assembler simply manipulates the handle 48 as described above with his fingers and such manipulation automatically properly mechanically clamps the connector 16 to the board 14. Therefore, assembly can be accomplished quite easily even if several assemblies 10 are arranged close together in a stack as depicted in FIG. 1.

It should be appreciated also that the connector 16 can be adapted to any board thickness simply by changing the spring member 42 so that it has the proper stiffness and arm length for the particular assembly. In other words, the spring can be designed for the particular application, thereby assuring that the correct clamping pressure is obtained to assure good electrical connections between the circuits being coupled. Furthermore, no change need be made in the construction of the connector 16 when coupling to different circuit board conductor patterns. Only the layout of the contacts 24a on the circuit 12 need be changed. Consequently, no expensive tooling is required to adapt the connector to different applications.

In the assembly illustrated in FIG. 1, the required upward extension of lever 48 in its releasing position limits the minimum distance between the PC boards in the stack. To permit closer packing, the lever 48 can be eliminated and the actuator body 56 rotated between its operative positions by other suitable means. For example, a screwdriver blade slot may be formed in the end of the actuator stub shaft 58a as shown in dotted lines at 82 in FIG. 2.

Figure 5:
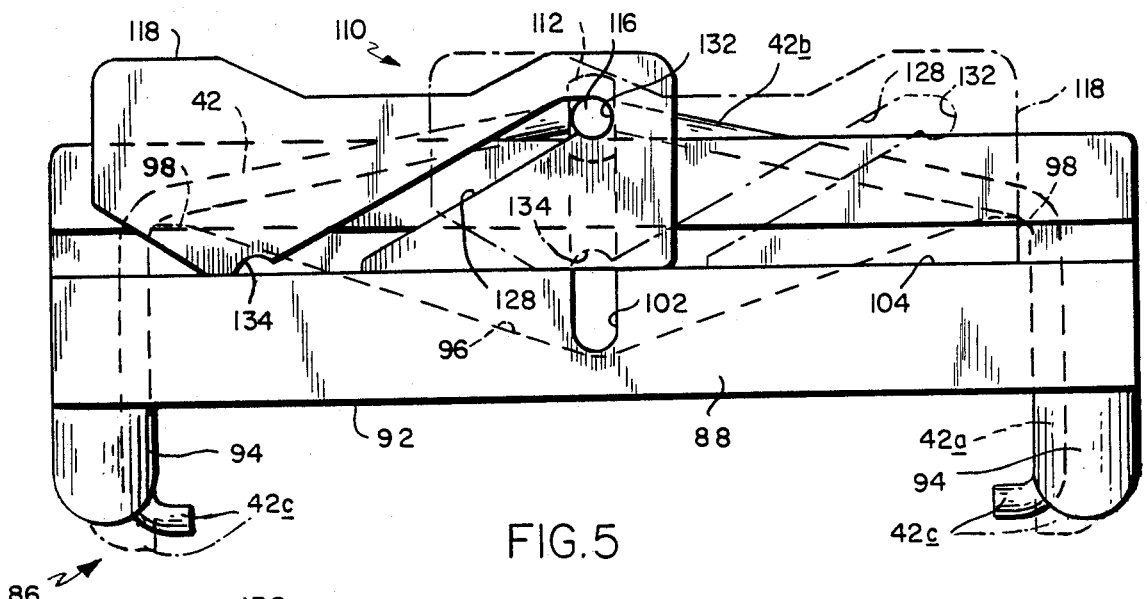
FIG. 5 is a front elevational view with parts broken away of another connector embodiment.
Figure 6:
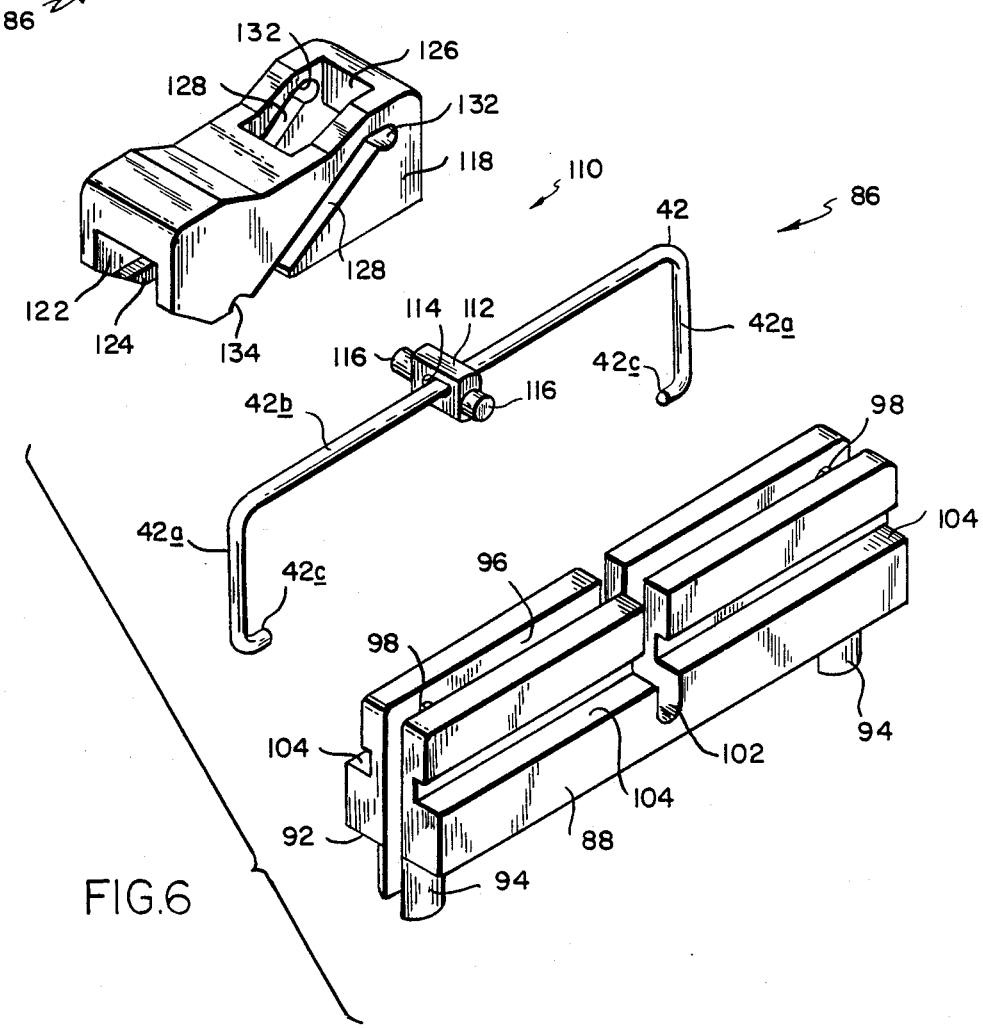
FIG. 6 is an exploded perspective view showing the components of the FIG. 5 connector in greater detail.

Also, other means may be provided to deflect the spring member 42 in order to operate the connector. FIGS. 5 and 6 illustrate a modified connector indicated generally at 86 employing a sliding type of actuator. This embodiment employs a frame 88 which defines at its underside a reference surface 92 to which is mounted the end of the flexible circuit 12 as described above. A pair of locating posts 94 project down from that surface at the opposite ends of frame 88. The frame also has a slot or groove 96 which extends all around the top and end walls of the frame defining fulcrums 98. Frame 88 differs from frame 34 in that it is formed with a transverse vertical slot 102 between fulcrums 98 which slot extends from the top of the frame all the way to the bottom of slot 96. Also, a pair of mirror-image lengthwise grooves 104 are formed in the front and rear walls of frame 88, extending the entire length thereof and the wall portions above those grooves are set back from the remainders of the walls.

Connector 86 employs a spring member substantially the same as the one described above. Accordingly it carries the same identifying numeral 42. The actuator shown generally at 110 for deflecting the spring member 42 comprises a generally rectangular cam follower 112 formed with a longitudinal passage 114 for receiving the spring member bridging segment 42b. Also a pair of stub shafts 116 project out laterally from opposite ends of cam follower 112. When the spring member 42 is clipped into the frame groove 96, the cam follower 112 and its stub shafts 116 are received in the transverse frame slot 102 and the cam follower is free to move up and down in that slot.

The other component of the actuator 110 is a finger actuated slider 118 which functions as a cam to effect vertical movement of the cam follower 112. The slider 118 is formed with a longitudinal groove 122 in its underside and a pair of flanges 124 project in from the side edges of that groove. The slider 118 is arranged to engage over frame 88 with the slide flanges 124 received in the frame slots 104 so that the slider can slide back and forth along the frame.

A generally rectangular vertical passage 126 extends all the way down through slider 118. Also a pair of mirror-image inclined slots 128 are formed in the side walls of slider 118 which slots communicate with vertical passage 126. The slots extend from the upper right hand end of passage 126 down to the locations adjacent the lower left hand end of slider 118 beyond the left-hand end of passage 126. A pair of circular notches 132 are provided at the upper ends of the inclined slots 128. Also a second pair of notches or cutouts 134 are formed in the undersides of flanges 124 at the side walls of the slider beyond the lower end of slots 128. These notches establish the locking and releasing positions respectively of the actuator 110.

To assemble the connector 86, the spring member 42 is clipped around the frame 88 in groove 96 with the cam follower 112 being received in the frame slot 102. The slider 118 is then slid onto the frame from the right-hand end thereof. The cam follower 112 is forced down into its slot 102 manually to permit the slider to slide beyond the slot 102 opening. This permits the cam follower to position itself within the slider passage 126 with the follower stub shafts 116 engaging in the inclined slots 128 at locations above the frame grooves 104.

When the slider 118 is located midway along the frame, the cam follower 112 is positioned midway along slots 128 so that the spring member bridging segment 42b is in its straight relaxed position. When the slider is slid to the right relative to the frame, as shown in dotted lines in FIG. 5, the cam follower is forced down the inclined slots 128, thereby deflecting the spring member bridging segment 42b downward toward the frame reference surface 92. Resultantly, the spring member arms 42a are sprung apart as described above so that their end hooks 42c are brought into alignment with the frame locating post 94. When the slider notches 134 are positioned opposite frame slot 102, the cam follower stub shafts 116 engage in those notches thereby retaining the connector in that releasing condition. Now the connector 86 with a flexible circuit 12 affixed thereto can be engaged to PC board 14 as described above.

As soon as the connector is seated on the board 14, the assembler can now slide slider 118 toward the left. First the spring member 42 resumes its relaxed condition whereby its arms 42a are drawn together so that the end hooks 42c engage the inboard edges of the board apertures 32 as described above. As the slider is slid further toward the left to its solid line position in FIG. 5, the cam follower 112 is urged upwardly in the inclined slots 128, so that the spring member bridging segment 42b is deflected upwardly as shown.

That upward deflection of the bridging segment 42b retracts the spring member on the frame 88 so that the end hooks 42c are drawn toward the frame reference surface 92 and are urged toward each other exactly as described above in connection with the connector 16. When the slider 118 is moved to its fully locking position, the follower stub shafts 116 engage in the cutouts 132 at the tops of the slots 128 thereby retaining the connector in that locked condition. When the connector 86 is locked, the spring member 42 clamps the connector tightly against the PC board 14. Also sufficient energy is stored in the spring member to compensate for variations in the thicknesses of the coupled-together circuits as described above.

Some applications may demand that a relatively long connector be used to couple circuits 12 and 14. However, the sprung-type gripping action of the connector 16 or 86 may become less effective as the length of the spring bridging segment 42b between the fulcrum and the actuator increases. That is, as that segment becomes longer, it may become more difficult to spread apart the arm hooks 42c by the necessary amount to permit their insertion through the PC board apertures 32 when the connector is released and still enable them to tightly grip the board when the connector is locked.

To overcome this potential problem, the parts of the actuator engaging the spring bridging segment 42b may be made longer. This effectively shortens the aforementioned spring segment length enabling even a long connector to operate properly and gain all of the advantages described herein.

In some instances, it is desirable that the corresponding circuit contacts 24a and 28a be brought together with a wiping action. This type of sliding contact or engagement tends to rub or scrape away any oxide or dirt film that may be present on the engaging surfaces of those contacts that could increase the electrical resistance at those connections.

Figure 7:
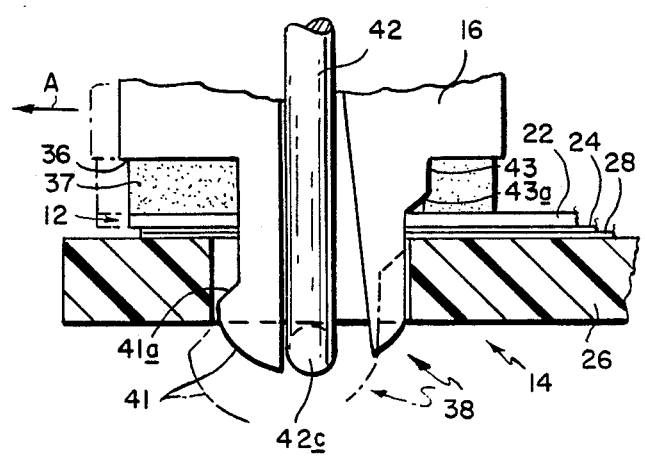
FIG. 7 is a fragmentary sectional view on a larger scale with parts in elevation showing the wiping contact that can be achieved by the present assembly.

FIG. 7 illustrates one mode of achieving such wiping contact with the present connection assembly. As shown there, the locating posts 38 of the connector 16 may be formed at their free ends with a lateral boss or bump 41. These bumps extend to one side of the connector, i.e. to the left as viewed in FIGS. 1 and 7, and their upper surfaces 41a are inclined. Similar laterally extending bosses or bumps 43 are formed at the opposite sides of posts 38 at the bases of the posts. The under surfaces 43a of those bosses are also inclined in the same direction as surfaces 41a.

Thus, when the connector posts 38 are inserted into the PC board openings 32 and the connector is clamped in place as described above, the inclined boss surfaces 41a and 43a engage the opposite upper and lower edges of openings 32. This camming or wedging engagement shifts the connector 16 and circuit 12 parallel to PC board 14, e.g. to the left in the direction of arrow A in FIG. 7. Such sliding motion causes the flexible circuit contacts 24a to wipe or rub along the PC board pads 28a as those contacts are brought into clamping engagement by connector 16.

Other techniques may be employed to provide such wiping contact. For example, a stiff, flat spring may be positioned between the frame reference surface 36 and the flexible circuit 12. The spring is H-shaped with each leg of the spring being more or less coextensive with the reference surface. The spring is bent or flexed back on itself, i.e. at the cross arm of the H, so that the two legs are in slightly spaced-apart superposition. The upper "leg" of the spring is positioned flush against the reference surface and is notched at its ends to interfit with posts 38. The lower leg which overlies the flexible circuit is desirably slit laterally to form individual fingers for each circuit contact 24a, thereby providing independent compliance for these contact areas. As the connector 16 and its circuit 12 are pressed against the PC board 14, that spring compresses or flexes to a substantially flat condition, forcing a slight but powerful sliding motion of the flexible circuit 12 relative to the PC board 14.

It will be seen from the foregoing, then, that the connector assemblies described herein provide significant advantages as compared with their prior counterparts. The assemblies require no soldering whatsoever. Rather, electrical connections are made directly between the coupled together conductors with the connectors themselves functioning as mechanical clamps. Resultantly, the connectors are quite simple in construction so that they can be manufactured quite easily at minimum cost. Furthermore, the connectors are quite compact, small and lightweight so that they occupy only a small space on the PC board and permit such boards to be stacked closely together. The connectors described herein can be scaled up or down as needed to accommodate them to flexible circuits of different size and can obviously accommodate circuits having a variety of different conductor termination patterns. They also have considerable tolerance for dimensional changes in the circuits which they are connecting together. Furthermore, they do not need to rely on resilient materials to derive the clamping force to effect the coupling. Therefore, the connectors have good long-term stability.

The present assembly is advantaged also in that no special modifications need be made to the PC board or other circuit coupled to. The only requirement is that locating means such as apertures 32 be provided on that board to help position the connector relative to the board's termination pads. These apertures in addition to locating the connector provide access for the spring member end hooks which clamp the connector to the board.

In this connection, it should be mentioned that other locating means may be utilized in lieu of the connector posts and board apertures. For example, instead of forming locating posts on the connector frame, recesses may be provided at those locations on the frame which are arranged to receive small bosses projecting up from the printed circuit board. Small dimples or recesses can be provided in the sides of those bosses for engaging the end hooks 42c of the spring member whose arms would extend down to those recesses.

Also, it should be appreciated that, because of its unique design, the connectors described herein can be used as a simple clamp to mechanically connect one component such as a flexible circuit or harness to another or to provide strain relief for that component. The same basic structure can also be modified so that the connector functions as a switch between the contacts of one circuit and those of another. To accomplish this, a thin resilient layer of electrically insulating material can be interposed between circuit 12 and PC board 14, a small section of which is shown in dotted lines at 144 in FIG. 2. Such strip being formed with small openings 146 directly opposite the circuit contacts 24a. As long as the connector is not in its locked condition, the connector exerts no clamping action on the PC board. Consequently, the contacts of the two circuits 12 and 14 remain spaced apart by that insulating strip. However, when the connector is in its locked position, the clamping force compresses that insulating strip so that the contacts of the two circuits touch to complete electrical connections between the two circuits.

It will thus be seen that the objects set forth above, among those made apparent from the preceding description, are efficiently attained, and, since certain changes may be made in the above constructions without departing from the scope of the invention, it is intended that all matter contained in the above description or shown in the accompanying drawings be interpreted as illustrative and not in a limiting sense.

It is also to be understood that the following claims are intended to cover all of the generic and specific features of the invention herein described.

What is claimed as new and desired to be secured by Letters Patent of the United States is:

1. A connector assembly comprising
   A. frame means defining a reference surface;
   B. spring means
      (1) movably mounted to the frame means, and
      (2) defining a pair of spaced-apart arm whose ends extend proximate to the reference surface; and
   C. actuating means movably mounted to the frame means in engagement with the spring means, said actuating means being movably between
      (1) a first position wherein the actuating means urge the spring means to an extended position on the frame means while simultaneously flexing the spring means so that said arm ends are spaced away from said reference surface and simultaneously spread apart,
      (2) a stable second position wherein the actuating means permit the spring means to relax whereby said arm ends spring together to an unstressed neutral position, and
      (3) a stable third position wherein the actuating means retract the spring means on the frame means while simultaneously flexing the spring means so that the arm ends are drawn in close to said reference surface and toward one another enabling those ends to engage an electrical circuit member and resiliently press that member toward said frame means reference surface.

2. The assembly defined in claim 1 and further including
   A. locating means formed at said reference surface; and
   B. an electrical circuit affixed to said reference surface, said circuit and locating means having interfitting portions that establish the position of the circuit relative to the frame means and provide strain relief for the circuit.

3. The assembly defined in claim 2 wherein the locating means comprise at least two projections spaced apart on said reference surface.

4. The assembly defined in claim 3 wherein said spring means arm ends are located at said projections.

5. The assembly defined in claim 4 wherein said arm ends terminate as hooks.

6. The assembly defined in claim 1 wherein the actuating means flex the spring means in opposite directions when moved to said first and third positions.

7. The assembly defined in claim 6 wherein the actuating means comprise rotary camming means.

8. A connector assembly comprising
   A. frame means defining a reference surfaces;
   B. spring means
      (1) movably mounted to the frame means, and
      (2) defining a pair of spaced-apart arms whose ends extend proximate to the reference surfaces;
   C. actuating means movably mounted to the frame means in engagement with the spring means, said actuating means being movably between
      (1) a first position wherein the actuating means urge the spring means to an extended position on the frame means and spring said arm ends apart,
      (2) a second position wherein the actuating means permit the spring means to relax whereby said arm ends draw together, and
      (3) a third position wherein the actuating means retract the spring means on the frame means enabling the arm ends to resiliently clamp an electrical circuit member to said frame means reference surface, and
   D. wherein said actuating means includes
      (1) a slider slidably mounted to the frame means for movement parallel to said reference surface; and
      (2) a cam formed on the slider so that
         (a) when the slider is slid in one direction along said frame means to said first position, the cam flexes the spring means in one direction towards said reference surface, and (b) when the slider is slid along the frame means in the opposite direction to said third position, the cam flexes the spring means in the opposite direction away from the reference surface.

9. The assembly defined in claim 8 wherein the spring means comprise a generally C-shaped spring wire having a pair of generally parallel arms connected by a bridging segment and terminated by hooks.

10. The assembly defined in claim 9 wherein the actuating means further include a cam follower
A. slidably mounted to the frame means for movement toward and away from said reference surface;
B. engaging the spring wire bridging segment; and
C. engaged by said slider cam.

11. A connector assembly comprising
A. frame means defining a reference surface;
B. a spring member engaged on said frame means, said spring member having
 (1) a pair of spaced-apart arms movable on said frame means in directions perpendicular to said reference surface, said arms having corresponding first ends extending proximate to said reference surface, and
 (2) a bridging segment spaced generally parallel to the reference surface extending between corresponding second ends of said arms; and
C. actuating means movably mounted to the frame means in engagement with said bridging segment, said actuating means being movable between
 (2) a first position wherein the actuating means deflect said bridging segment from a relaxed position toward said reference surface whereby said first ends of said spring member arms are moved to extended positions spaced away from said reference surface and are simultaneously spread apart, and
 (2) a second position whereby the actuating means deflect said bridging segment from its relaxed position away from the reference surface whereby said first ends of the spring member arms are moved to retracted positions on said frame means closer to said reference surface and simultaneously drawn toward one another enabling those ends to engage and resiliently press a printed circuit member toward said reference surface.

12. The assembly defined in claim 11 wherein said arm first ends terminate as hooks.

13. The assembly defined in claim 11 and further including means for releasably retaining the actuating means in its first and second positions.

14. The assembly defined in claim 11 wherein the actuating means include cam means
A. rotatively mounted to the frame means; and
B. having cam surfaces which engage and deflect the spring member bridging segment.

15. The assembly defined in claim 11 and further including a first electrical circuit having one surface affixed to said reference surface, said circuit having exposed contacts present at the surface thereof opposite said one surface.

16. The assembly defined in claim 15 wherein said first circuit is flexible.

17. The assembly defined in claim 16 and further including locating means formed at said reference surface.

18. The assembly defined in claim 17 wherein the locating means are arranged and adapted to facilitate proper positioning o the first circuit on said reference surface.

19. The assembly defined in claim 18 wherein said locating means interfit with said first circuit so as to provide strain relief therefor.

20. A connector assembly comprising
A. frame defining a reference surface;
B. a spring member engaged on said frame means, said spring member having
 (1) a pair of spaced-apart arms movable on said frame means in directions perpendicular to said reference surface, said arms having corresponding first ends extending proximate to said reference surface, and
 (2) a bridging segment spaced generally parallel to the reference surface extending between corresponding second ends of said arms;
C. actuating means movably mounted to the frame means in engagement with said bridging segment, said actuating means being movable between
 (1) a first position wherein the actuating means deflect said bridging segment from a relaxed position toward said reference surface whereby said first ends of said spring member arms assume extended positions and are spread apart, and
 (2) a second position wherein the actuating means deflect said bridging segment from its relaxed position away from the reference surface whereby said first ends of the spring member arms assume retracted positions on said frame means and are urged together;
D. a first electrical circuit having one surface affixed to said reference surface, said circuit having exposed contacts present at the surface thereof opposite said one surface; and
E. a thin resilient pad positioned between the reference surface and said one surface of the first circuit.

21. A connector assembly comprising
A. frame means defining a reference surface;
B. a spring member engaged on said frame means, said spring member having
 (1) a pair of spaced-apart arms movable on said frame means in directions perpendicular to said reference surface, said arms having corresponding first ends extending proximate to said reference surface, and
 (2) a bridging segment spaced generally parallel to the reference surface extending between corresponding second ends of said arms;
C. actuating means movably mounted to the frame means in engagement with said bridging segment, said actuating means being movable between
 (1) a first position wherein the actuating means deflect said bridging segment from a relaxed position toward said reference surface whereby said first ends of said spring member arms assume extended positions and are spread apart, and
 (2) a second position wherein the actuating means deflect said bridging segment from its relaxed position away from the reference surface whereby said first ends of the spring member arms assume retracted positions on said frame means and are urged together;
D. a first electrical circuit having one surface affixed to said reference surface, said circuit having exposed contacts present at the surface thereof opposite said one surface; and E. a resilient, electrically-insulating pad engaging said opposite surface of said first circuit, said pad having openings opposite said circuit contacts so that, when the frame means is clamped by said spring member to a second circuit positioned against said pad, said contacts can engage said second circuit through said openings.

22. A connector assembly comprising

A. frame means defining a reference surface;

B. a spring member engaged on said frame means, said spring member having
  (1) a pair of spaced-apart arms movable on said frame means in directions perpendicular to said reference surface, said arms having corresponding first ends extending proximate to said reference surface, and
  (2) a bridging segment spaced generally parallel to the reference surface extending between corresponding second ends of said arms;

C. actuating means movably mounted to the frame means in engagement with said bridging segment, said actuating means being movable between
  (1) a first position wherein the actuating means deflect said bridging segment from a relaxed position toward said reference surface whereby said first ends of said spring member arms assume extended positions and are spaced apart, and
  (2) a second position wherein the actuating means deflect said bridging segment from its relaxed position away from the reference surface whereby said first ends of the spring member arms assume retracted positions on said frame means and are urged together;

D. a first electrical circuit having one surface affixed to said reference surface, said circuit having exposed contacts present at the surface thereof opposite said one surface;

E. a second electrical circuit, said second circuit having exposed contacts for registering with the exposed contacts of the first circuit;

F. coacting locating means on said frame means and second circuit which locate the first and second contacts in registration; and G. means on said second circuit for interfitting with said spring member arm ends when the two circuits are positioned together with their contacts in registration and the actuating means are in their said first position so that, when the actuating means are moved to their said second position, the spring member mechanically clamps the first circuit to the second circuit so that their contacts are in engagement.

23. The assembly defined in claim 22 and further including means for shifting the first circuit generally parallel to the second circuit as they are clamped together so that their corresponding contacts wipe against one another.

24. The assembly defined in claim 23 wherein the shifting means include cam means formed on said frame means.

25. A connector assembly comprising

A. frame means defining a reference surface;

B. a spring member engaged on said frame means, said spring member having
  (1) a pair of spaced-apart arms movable on said frame means in directions perpendicular to said reference surface, said arms having corresponding first ends extending proximate to said reference surface, and
  (2) a bridging segment spaced generally parallel to the reference surface extending between corresponding second ends of said arms;

C. actuating means movably mounted to the frame means in engagement with said bridging segment, said actuating means being movable between
  (1) a first position wherein the actuating means deflect said bridging segment from a relaxed position toward said reference surface whereby said first ends of said spring member arms assume extended positions and are spread apart, and
  (2) a second position wherein the actuating means deflect said bridging segment from its relaxed position away from the reference surface whereby said first ends of the spring member arms assume retracted positions on said frame means and are urged together; and D. wherein said actuating means include
  (1) a cam follower engaging the spring member bridging segment, and
  (2) cam means mounted to the frame means for lengthwise sliding movement thereon, said cam means having at least one cam surface engaging the cam follower that moves the follower in a direction generally perpendicular to said reference surface when the cam means is slid along the frame means.

26. A connector assembly comprising

A. frame means defining a reference surface;

B. a spring member engaged on said frame means, said spring member having
  (1) a pair of spaced-apart arms movable on said frame means in directions perpendicular to said reference surface, said arms having corresponding first ends extending proximate to said reference surface, and
  (2) a bridging segment spaced generally parallel to the reference surface extending between corresponding second ends of said arms;

C. actuating means movably mounted to the frame means in engagement with said bridging segment, said actuating means being movable between
  (1) a first position wherein the actuating means deflect said bridging segment from a relaxed position toward said reference surface whereby said first ends of said spring member arms assume extended positions and are spread apart, and
  (2) a second position wherein the actuating means deflect said bridging segment from its relaxed position away from the reference surface whereby said first ends of the spring member arms assume retracted positions on said frame means and are urged together; and D. wherein said actuating means include
  (1) a first circuit placed adjacent said frame means reference surface; and
  (2) means carried by said frame means for causing portions of the first circuit to wipe along portions of a second circuit to which the first circuit is clamped when the actuating means is moved to its said second position.

27. A connector assembly comprising

A. frame means defining a reference surface;

B. locating means formed at said reference surface;

C. spring means (1) movably mounted to the frame means, and
(2) defining a pair of spaced-apart arms whose ends
   (a) extend proximate to the reference surface;
   (b) have free ends which extend laterally of said arms, and
   (c) are movable relative to said locating means between first positions wherein said arm ends are spaced away from said reference surface and are aligned with said locating means and second positions wherein said arm ends are spaced closer to said reference surface and project laterally of said locating means; and D. actuating means movably mounted to the frame means in engagement with the spring means, said actuating means being movable between
   (1) a first position wherein the actuating means shift the spring means to an extended position on the frame means and simultaneously position said spring arms in their said first positions, and
   (2) a second position wherein the actuating means flexingly retract the spring means on the frame means and simultaneously move said arms to their said second positions enabling said arm ends to resiliently press an electrical circuit member toward said frame reference surface.

28. The assembly defined in claim 27 wherein said arm ends terminate as hooks.

29. The assembly defined in claim 27 and further including an electrical circuit affixed to said reference surface, said circuit and locating means having interfitting portions that establish the position of the circuit relative to the frame means and provide strain relief for the circuit.

30. A connector assembly comprising
A. frame means defining a reference surface;
B. locating means formed at said reference surface;
C. a spring member engaged on said frame means, said spring member having
   (1) a pair of spaced-apart arms movable on said frame means in directions perpendicular to and generally parallel to said reference surface, said arms having corresponding first ends extending to said locating means, and
   (2) a bridging segment spaced generally parallel to the reference surface extending between corresponding second arms of said arms; and
D. actuating means movably mounted to the frame in engagement with said spring bridging segment, said actuating means being movable between
   (1) a first position wherein the actuating means position said bridging segment toward said reference surface so that said first ends of said spring member arms assume extended positions spaced away from said reference surface in alignment with said locating means, and
   (2) a second position wherein the actuating means flex said spring bridging segment away from said reference surface whereby said first ends of the spring member arms are shifted laterally of said locating means and assume retracted positions on said frame means closer to said reference surface enabling said arm first ends to engage and resiliently press an electrical circuit toward said frame reference surface.

31. The assembly defined in claim 30 wherein said arm first ends terminate as hooks.

32. The assembly defined in claim 30 wherein said locating means comprise a pair of projections spaced apart on said frame reference surface.

33. The assembly defined in claim 30 wherein said actuating means comprise rotary camming means.

* * * * *